United States Patent [19]

Ramaprasad

[11] Patent Number: 4,770,716

[45] Date of Patent: * Sep. 13, 1988

[54] STABILIZATION OF INTRACONNECTIONS AND INTERFACES

[75] Inventor: K. R. Ramaprasad, Lawrenceville, N.J.

[73] Assignee: Chronar Corp., Princeton, N.J.

[ * ] Notice: The portion of the term of this patent subsequent to Jun. 23, 2004 has been disclaimed.

[21] Appl. No.: 40,205

[22] Filed: Apr. 16, 1987

Related U.S. Application Data

[63] Continuation-in-part of Ser. No. 859,504, Apr. 5, 1986, Pat. No. 4,675,466.

[51] Int. Cl.$^4$ .................... H01L 27/14; H01L 31/18
[52] U.S. Cl. .................... 136/244; 136/258; 437/2; 437/4; 437/180; 437/205
[58] Field of Search ............ 136/244, 258 AM; 427/307; 437/2, 4, 180, 205, 210; 357/30 J, 30 K, 59 C

[56] References Cited

U.S. PATENT DOCUMENTS 4,675,466  6/1987  Ramaprasad .................... 136/244

*Primary Examiner*—Aaron Weisstuch
*Attorney, Agent, or Firm*—George E. Kersey

[57] ABSTRACT

Stabilization of energy sensitive semiconductor devices by forming initial electrodes which are exposed through an overlying layer of semiconductor, dipping the exposed electrodes in solutions containing specified chemicals, such as metallic ion solutions of nickel, cobalt, chromium and related metals, followed by rinsing, drying, and the final deposition of an overlying electrode by metallization.

20 Claims, 3 Drawing Sheets

STABILIZATION OF INTRACONNECTIONS AND INTERFACES

This is a continuation-in-part of Ser. No. 859,504, filed Apr. 5, 1986, now U.S. Pat. No. 4,675,466. The invention relates to the stabilization of intraconnected devices, i.e., those with internal connection, and, more particularly, to the stabilization of intraconnected energy sensitive devices such as solar cells.

Energy sensitive devices such as amorphous silicon solar cells are vulnerable to various kinds of degradation that affect their performance. One important kind of degradation results in panel deterioration and arises because of thermal soaking or cycling of the electrical contact between a back electrode, usually aluminum, and a front electrode, usually conductive tin oxide, in the common panel configuration of intraconnected elements of glass, tin oxide, PIN amorphous silicon, and aluminum.

A further complicating factor is the interdiffusion of silicon and aluminum at the back contact interface, namely between n-type amorphous silicon and aluminum. This type of cell degradation is continuous and non-reversible, under thermal cycling. It seriously curtails the useful lifetime of the solar panels in the field.

In the general practice of manufacturing amorphous silicon solar cells, a succession of layers are deposited, one on top of the other, on a suitable substrate. For example, glass is a commonly used substrate on which a transparent conductive tin oxide layer is deposited. Individual electrodes are created by patterning the tin oxide. This is followed by the deposition of P, I, and N types of amorphous silicon based alloys. The semiconductor layers are opened to expose a thin line of the underlying tin oxide. The final step is to produce an intraconnected solar panel. The most common technique for the last step is vacuum metallization.

When amorphous silicon is opened to expose the underlying tin oxide, it is likely that the site thus created will not provide a good contact on subsequent metallization and subjection to thermal cycling. Further, under the same conditions of outdoor thermal cycling or soaking, there is a gradual interdiffusion between silicon and aluminum as indicated by accelerated testing.

Accordingly, it is an object of the invention to improve the stabilization of the intraconnections in devices, particularly the intraconnections in solar cells.

Another object of the invention is to reduce the degradation that occurs during the thermal cycling of interconnectors, particularly solar cells.

Still another object of the invention is to reduce interdiffusion at contact interfaces, particularly in solar cells between a semiconductor and a metal contact.

SUMMARY OF THE INVENTION

In accordance with the present invention, energy sensitive panels, after initial electrode formation, but before final electrode formation, are dipped in solutions containing specified chemicals, followed by rinsing and drying. Then the final electrode is formed, typically deposited by metallizing.

In one practice of the invention, panels with patterned amorphous silicon and exposed front electrodes of conductive tin oxide are dipped in an acid solution, such as 30% phosphoric, for a prescribed period, about 30 seconds, and rinsed in de-ionized water. Alternately, following the acid dip or indeendently of it, the panels are dipped in a solution containing a compound that complexes with transition metal ions, for a prescribed period, for example 30 seconds, followed by rinsing with de-ionized water.

In the next step, the panels are dipped in a metallic ion solution, desirably of nickel, cobalt, chromium, or related metals. A suitable metallic ion solution includes nickel sulfate, boric acid, and ammonium chloride. The time for metal ion treatment is prescribed, e.g., 30 seconds, and the treated panels are then rinsed in deionized water, dried using another rinse, for example isopropanol, and then subjected to back electrode deposition.

The following concentrations are illustrative only. Lower or higher metal ion concentrations are suitable. For low concentrations (2% nickel ion), a longer dipping time might be required. For concentrations higher than about 12% nickel ion and 1.5% each of boric acid and ammonium chloride, there is a reduction in cost effectiveness for the manufacturing process.

In another practice of the invention, it has been found beneficial to heat the amorphous silicon panels after dipping, but before depositing the second electrode, such as aluminum, in air in the temperature range from about 100 C. to 150 C. for a period of about 30 minutes to 3 hours. The preferred temperature is 120 C., and the preferred time is one hour.

In the practice of the method of the invention, semiconductor devices with interconnections are stabilized towards thermal cycling by (a) providing the device with a first electrode which is exposed through an overlying layer of semiconductoor, (b) dipping the device in aqueous phosphoric acid solution (for example 30% by volume) for about 30 seconds, (c) dipping the device after step (b) or independently of it, in a solution that contains a compound which can complex with a metal ion, (d) further dipping the device in a metallic ion solution for 30 seconds for example, (e) providing a further metallic back contact to the first front contact. The device is rinsed in de-ionized water between the various dips. The complexing solution in step (c) can be aqueous ammonium hydroxide solution. A suitable concentration for the ammonium hydroxide solution is in the range from 10 to 50% by volume, and the dipping time is in the range of approximately 10 to 60 seconds. The rinse in step (d) is followed by an iso-propanol rinse. Another practice of the invention involves heating the devices in the temperature range of 100–150 C., for 30 minutes to 3 hours, after step (d) and before back metallization. The preferred temperature is 120 C. and the preferred time of heating is one hour.

In accordance with another practice of the invention, the metallic ion solution can contain nickel ions. A suitable nickel ion solution is nickel sulfate with a nickel ion concentration of about 3–12%. The device desirably is rinsed in de-ionized water after being dipped in the metallic ion solution, and then is dried with an isopropanol rinse.

In accordance with yet another practice of the invention, a suitable metallic ion is chromium.

A further method of stabilizing a semiconductor device with intraconnections, where the device is a solar cell panel with a front electrode of conductive metal oxide underlying a layer of amorphous semiconductor, includes (a) providing the device with a front electrode which is exposed through a layer of amorphous semiconductor; (b) dipping the device in aqueous phosphoric acid solution (for example 30% by volume) for about 30 seconds, (c) dipping the device after step (b) or without it, in a solution that contains a compound which can complex with a metal ion, (d) further dipping the device in a metallic ion solution for 30 seconds for example, (e) providing a further metallic back contact to the first front contact. The device is rinsed in de-ionized water in between the various dips. Another practice of the invention involves heating the solar panels in the temperature range of 100–150 C., for 30 minutes to 3 hours, after step (d) and before back metallization. The preferred temperature is 120 C. and the preferred time of heating is one hour.

The dips can be combined; an acid solution and a metallic ion solution can be combined to provide a single bath. The second dipping advantageously is followed by back metal deposition to provide the final contacting element. One or all of the solutions desirably includes a surfactant to promote contact between the surface and the solution.

A semiconductor device with intraconnected electrodes, includes a substrate; a first electrode on the substrate; an amorphous semiconductor on the first electrode; adsorbed metallic ions on the first electrode and the amorphous semiconductor; and a second electrode on the semiconductor extending into contact with said first electrode at the interface of said first electrode and said metallic ions.

In the above device, the metallic ions can include nickel or chromium. When the device is a solar cell panel, it includes a substrate with a plurality of discrete transparent conductive first electrodes, an amorphous semiconductor forming a layer on the transparent electrodes; a plurality of second electrodes on the semiconductor layer opposite the transparent electrode; and an interface between each separate transparent electrode and the opposite second electrode, with metallic ions at said interface. The invention enhances the thermal stability of the solar panel.

In the above device, metallic ions are adsorbed upon the first electrode and the amorphous semiconductor to promote contact stability with said first electrode and interface stability between the amorphous semiconductor and the second electrode.

BRIEF DESCRIPTION OF THE DRAWINGS

Other aspects of the invention will become apparent after considering several illustrative embodiments, taken in conjunction with the drawings in which.

DETAILED DESCRIPTION

Figure 1C:
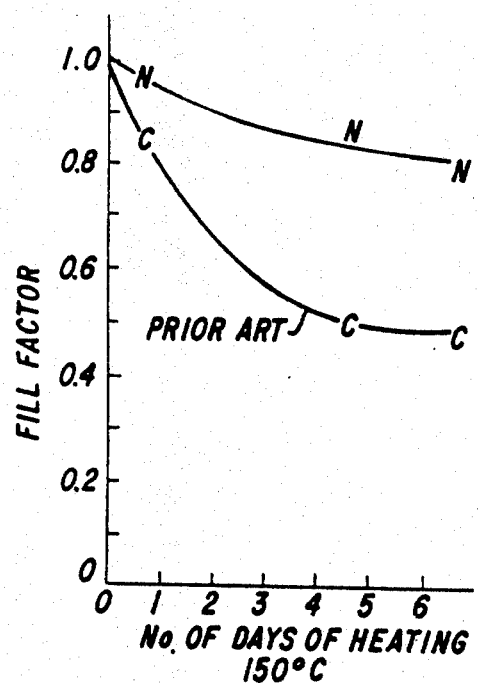
FIGS. 1A through 1D are graphs comparing untreated panels with those in accordance with the invention for various normalized photovoltaic factors over prescribed periods of thermal cycling.
Figure 1D:
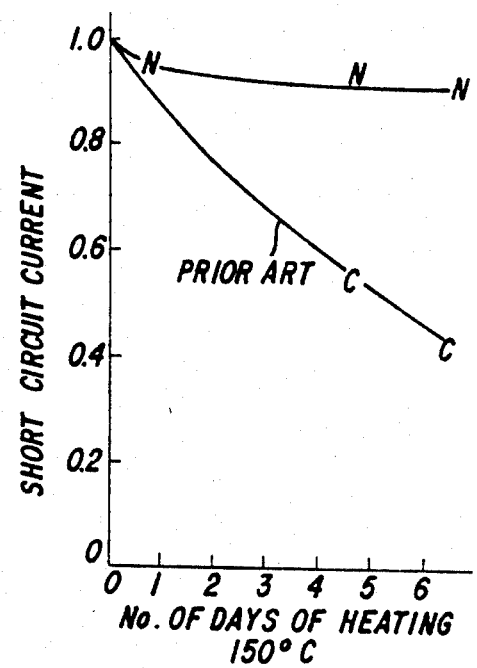
Figure 1A:
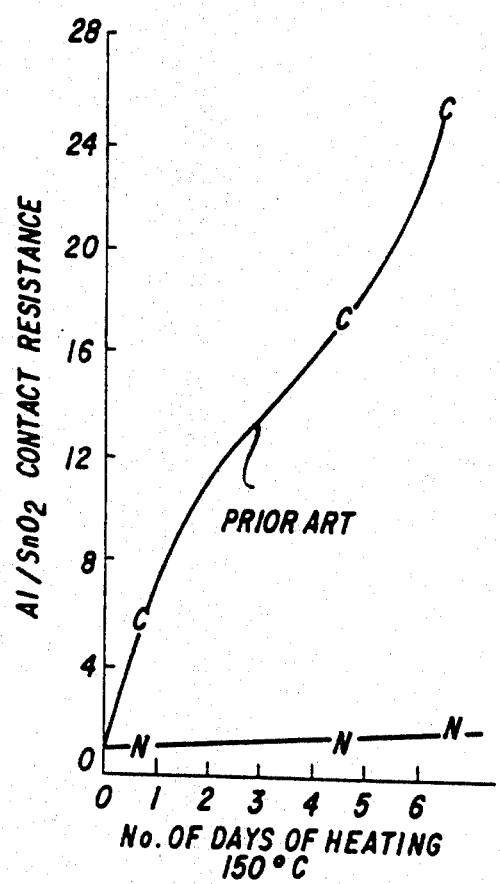

With reference to the drawings, FIG. 1A illustrates the effect of thermal cycling on contact resistance for untreated panels, and those treated in accordance with the invention, specifically phosphoric acid dip followed by the nickel solution dip.

In FIG. 1A the untreated panels ("control") are represented by various test positions designated by "C". It is seen that after six days of thermal cycling at 150 degrees Centigrade, the contact resistance of the intraconnect for a standard panel rose by a factor of 22. In the case of panels that are treated in accordance with the invention with a preliminary dip in acid solution followed by dipping in a metallic ion solution, in accordance with the invention, after six days of thermal cycling at 150 degrees Centigrade, the contact resistance had increased by a factor of only 1.8. This represents a significant improvement by comparison with the substantial increase in contact resistance that characterized the untreated panels.

Figure 1B:
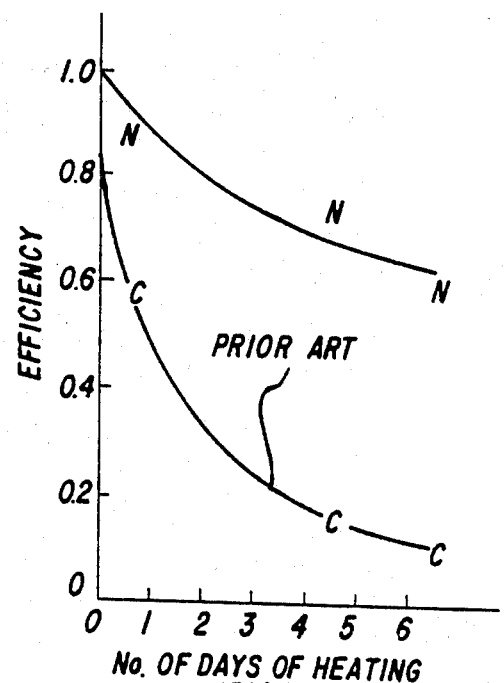

Similarly, in a comparison of efficiency (percentage of light converted to electrical power) of untreated panels with treated panels, the untreated panels, with test points represented by "C", showed a reduction in efficiency by a factor of 10 after six days of thermal cycling at 150 degrees Centigrade (FIG. 1B). By contrast, the panels treated in accordance with the invention, with test points indicated by "N", showed a reduction in efficiency by a factor of 1.6. Here again, there is a significant improvement in stabilizing the efficiency. It will be appreciated that the thermal cycling tests conducted at 150 degrees Centigrade represent significantly accelerated aging, and, although practiced over a period of six days, correspond in actual environmental exposure to a substantially increased period of time on the order of a number of years.

In a further example of the advantage provided by the invention, FIG. 1C compares fill factors of treated and untreated panels, ("C") and ("N"). It is apparent from FIG. 1C that untreated panels ("C") sustained a reduction in fill factor by 50%, whereas the treated panels ("N") have a reduction in fill factor of 20%.

A further example of the invention is illustrated in FIG. 1D, where untreated panels ("C") sustained a reduction in short circuit current of 55% after six days of thermal cycling. By contrast, treated panels ("N") sustained a reduction in short circuit current of about 10% after six days of thermal cycling at elevated temperatures (150 degrees Centigrade).

In another example of thermal cycling of treated and untreated panels, two solar panels with individual cell structures formed by layers of glass, tin oxide, PIN amorphous silicon, and aluminum were heated at 150 degrees Centigrade for 22 hours. One panel was a control and the other was stabilized in accordance with the invention, specifically acid dip followed by nickel solution dip. Upon subjecting the two panels to scanning Auger analysis, it was found that silicon could be detected through the aluminum grain boundary of the control panel. By contrast, silicon was detected only to a distance of about 750 angstroms from the aluminum-amorphous silicon interface of the stabilized panel. This AES (Auger) depth profile was not corrected for the interface broadening effects of the sputter profiling technique. Accordingly, the actual aluminum-silicon interface is narrower than indicated by the above analysis. The same type of analysis performed in separate experiments also revealed that nickel is adsorbed by both the tin oxide surface and the amorphous silicon surface.

This is a clear indication of the capability of the present invention to retard the interdiffusion of aluminum and silicon at the interface between a metallic electrode and a layer of silicon.

A further illustration of the advantages of the invention is provided by the test results summarized in FIGS.

Figure 2C:
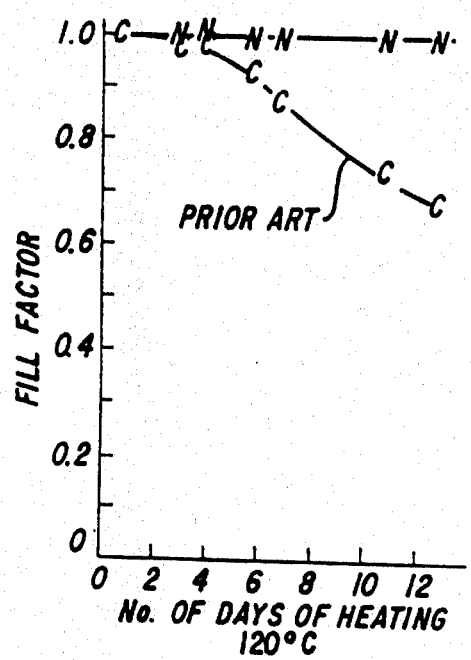
FIGS. 2A and 2B are graphs showing the effects on various normalized paramenters of untreated panels in comparison with panels that have been treated in accordance with the invention.
Figure 2D:
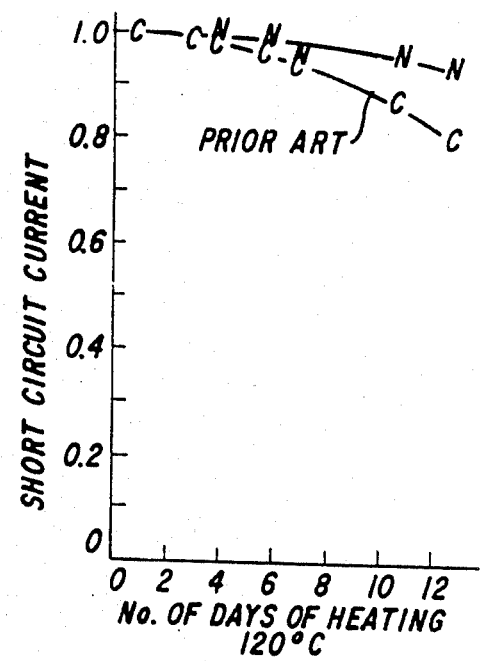
Figure 2A:
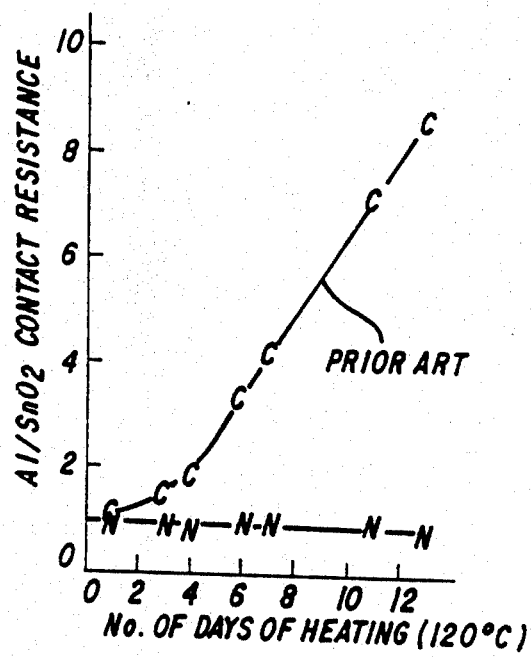

2A through 2D. For the graphs of these figures, control and treated solar panels were heated at 120 degrees Centigrade and their photovoltaic parameters were measured as a function of time. As indicated in FIG. 2A, the contact resistance (between Al and SnO$_2$) of the control panel (indicated with "C" test points) increased by a factor of 8.5 after 300 hours at 120° Centigrade.

Figure 2B:
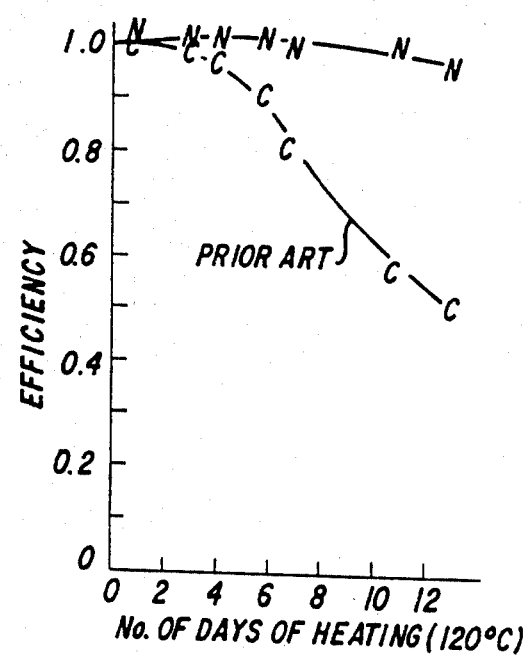

However, the panel treated according to the invention (acid dip followed by nickel solution dip) showed hardly any change in the Al/SnO$_2$ contact resistance after thermal cycling at 120 degrees Centigrade for the same period (300 hrs.). These are indicated by points "N" in FIG. 2A. Similar stabilizing effects of the method of the present invention on other photovoltaic parameters are depicted in FIGS. 2B-D after heating for 300 hours at 120 degrees Centigrade.

It has been theorized that the initial acid dip which is the first step in the practice of the process has a cleansing effect on the panels and prepares the panels for the metallic ion dip.

As indicated in FIGS. 3A through 3D, the preliminary acid dip, taken alone, provides an improvement over the untreated control panels, but its effect is not nearly as significant as that of the metallic ion dip taken alone. Thus, in FIG. 3A, the contact resistance of the untreated panel increased by a factor of 11.5 after 50 hours of thermal cycling at 150 degrees Centigrade. By significant contrast, the panels treated with the preliminary dip alone, for example phosphoric acid, with test points indicated by the designation "P" showed an increase in contact resistance after 50 hours by a factor of 2.5. However, in the case of the metal ion dip (nickel) with test points indicated by "N", the increase in contact resistance was merely by a factor of 1.5

Similarly, in the case of efficiency, there was a significant reduction (75%) for the control sample, as before. This is in contrast with a reduction by 30% for the acid cleansed samples, and by comparison with the slight reduction by 10% for the metallic ion solution. The results of FIG. 3B are also confirmed by FIG. 3C, where the fill factor for the control sample was reduced by 50%, but the fill factor for the cleansing acid bath was reduced by 25%, while the nickel ion bath produced substantially no change (about 5% reduction), even after 50 hours of thermal soaking at 150 degrees Centigrade.

Figure 3C:
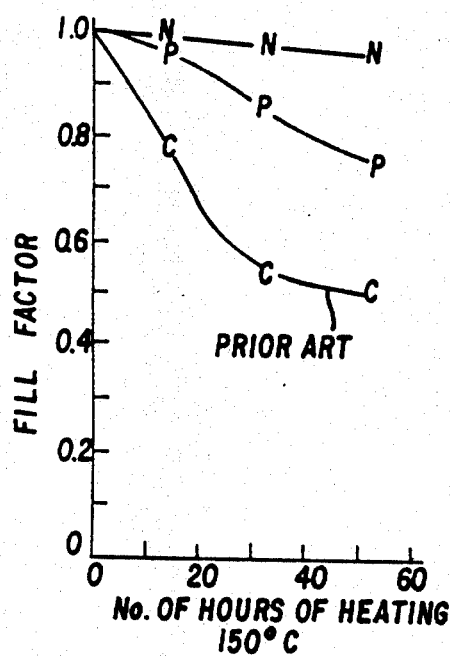
FIGS. 3A through 3D are graphs illustrating the effects of thermal cycling on untreated panels in comparison with variously treated panels in accordance with the invention.
Figure 3D:
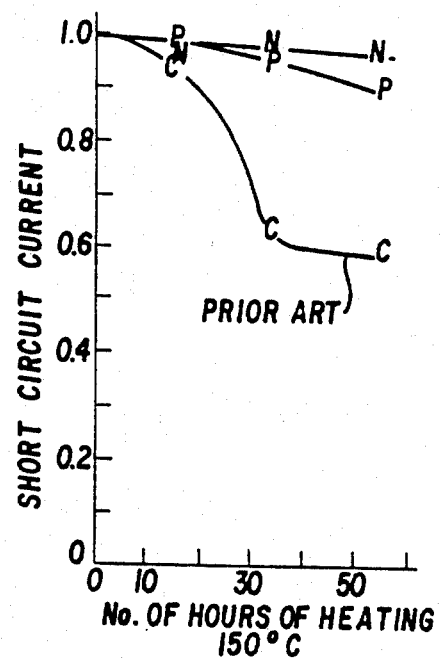
Figure 3A:
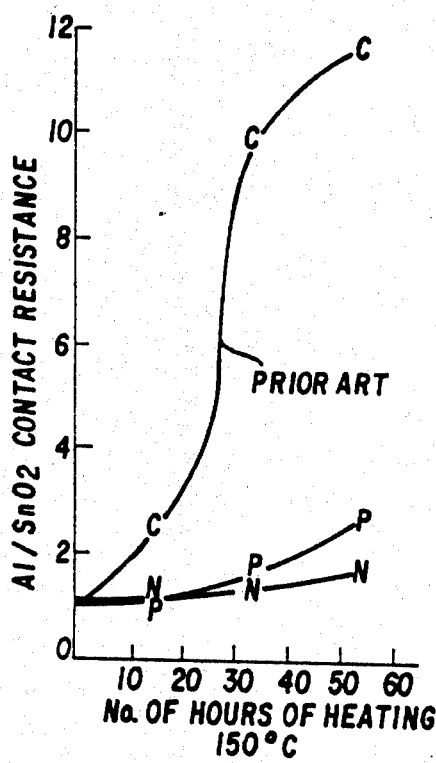
Figure 3B:
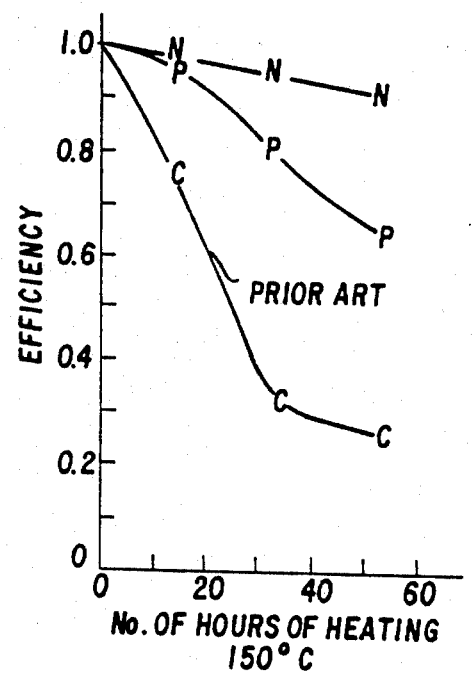

Finally, in the case of FIG. 3D, the short circuit current sustained a significant reduction for the control sample, but was virtually unchanged (or marginally reducedA) for both the acid and the nickel baths, with the nickel (ion) bath producing virtually no change and being superior to the cleansing bath taken alone.

The results summarized by FIGS. 3A through 3D refer to the treatment, and in the case of the control sample, the lack of treatment, before aluminum metallization. After aluminum metallization, all of the samples were heated at 150 degrees Centigrade and the various parameters were measured as a function of time and plotted as normalized parameters.

It is seen from FIGS. 3A through 3D that the untreated panel degrades very rapidly, but the metal ion and the acid dipped panels show superior stability in the face of thermal cycling and soaking at 150 degrees Centigrade.

The better performance of the panels which are dipped in metallic ions alone may be attributable to the ability of the adsorbed metallic ions on the amorphous silicon and the exposed front electrode (SnO$_2$) to significantly limit interdiffusion of aluminum and silicon at the semiconductor metal interface, and the promotion of better contact between Al & SnO$_2$.

It is to be noted that the acid and metallic ions solution can be mixed so that only one dip is used instead of two separate dips. The boric acid in the metallic ion solution is desirable in acting as a buffer. In addition, other ions can be used, such as chromium and related metallic components.

The foregoing detailed description is for illustration only and it will be apparent that other adaptations of the invention will occur to those of ordinary skill in the art.

For example, in another variation of the present invention, the solar panels or semiconductor devices (with or without the acid dip) could be dipped in a solution containing compounds that complex with metal ions like nickel. After rinsing, the panels or devices are dipped in the metallic ion solution, resulting in better adherence of metallic ions. One illustration of this practice is to use an aqueous solution of ammonium hydroxide (10-50% by volume in concentration, preferrably 40%) as the complexing agent. The time of dipping is 10-60 seconds, preferably 30 seconds. This dip is followed by the regular metallic ion solution dip. Other examples of complexing agents for metallic ions like nickel include glycol, ethylenediamine and dimethylglyoxime. In the case of some agents, a methanolic (or other suitable solvent) solution of the complexing agent is used in lieu of an aqueous medium. This is dictated by solubility considerations of the complexing agent.

In another practice of the invention, it is beneficial to heat the panels or devices after the dipping procedure is completed, but before the back metallic contact (for example Al) is deposited. The temperature range is 100-150 C., and the duration of heating is 30 minutes to 3 hours. The preferred temperature is 120 C. and the preferred duration of heating is one hour.

What is claimed is:

1. The method of stabilizing semiconductor devices with interconnections, which comprises the steps of:
    (a) providing the devices with a first electrode which is exposed through an overlying layer of semiconductor;
    (b) dipping the device in an acid solution and/or dipping the device in a solution that contains a compound which can complex with a metallic ion;
    (c) further dipping the device in a solution containing said metallic ion; and
    (d) providing a further contact to the first contact.

2. The method of claim 1 wherein the acid solution is about 30% phosphoric by volume and said device is rinsed after each dipping step in de-ionized water.

3. The method of claim 2 wherein each device is dried with an isopropanol rinse after the final rinse with de-ionized water.

4. The method of claim 1 wherein the second dip of step (b) contains ammonium hydroxide with a concentration in the range from 10 to 50% by volume and the dipping time is approximately in the range from 10 to 60 seconds.

5. The method of claim 1 wherein the metallic ion solution of step (c) contains nickel or chromium ions.

6. The method of claim 5 wherein the nickel ion solution is nickel sulfate with a nickel ion concentration range of about 3-12% by weight.

7. The method of claim 5 wherein the device is heated, after an isopropanol rinse, in the range of 100-150 C., for a duration of 30 minutes to 3 hours.

8. The method of claim 7 wherein the preferred values are 120 C. and one hour.

9. The method of claim 1 wherein the compound of step (b) used to complex the metallic ion is from the group including glycol, ethylenediamine, and dimethylglyoxime.

10. The method of claim 1 wherein at least one of the solutions includes a surfactant to promote contact between the surface of the device and the solution.

11. The method of stabilizing a semiconductor device with intraconnections wherein the device is a solar cell panel with a front electrode of conductive metal oxide underlying a layer of amorphous semiconductor, which comprises the steps of:
   (a) providing said device with said front electrode which is exposed through said layer of amorphous semiconductor;
   (b) dipping the device in an acid solution and/or dipping the device in a solution that contains a compound which can complex with a metallic ion;
   (c) further dipping the device in a solution containing said metallic ion and
   (d) providing a further contact to the first contact.

12. The method of claim 11 wherein said acid solution is about 30% phosphoric by volume and said device is rinsed after each dipping step in de-ionized water.

13. The method of claim 11 wherein the acid solution of step (b) and the metallic ion solution of step (c) are combined to provide a single bath and no complexing is used.

14. The method of claim 11 wherein the devices are given an isopropanol rinse after the last dipping.

15. The method of claim 14 wherein the isopropanol rinse is followed by metal deposition to provide the further contact.

16. The method of claim 15 wherein the devices are heated in the range of 100-150 C. for a duration of 30 minutes to 3 hours before depositing the further contact metal.

17. A semiconductor device with intraconnected electrodes, comprising
   a substrate;
   a first electrode on said substrate;
   an amorphous semiconductor on said first electrode;
   adsorbed metallic ions on said exposed first electrode and said amorphous semiconductor;
   and a second electrode on said semiconductor extending into contact with said first electrode at the interface of said first eletrode and said adsorbed metallic ions.

18. The apparatus of claim 17 wherein the metallic ions are selected from the class consisting of nickel and chromium.

19. The apparatus of claim 18 wherein said apparatus is a solar cell panel comprising said substrate with a plurality of discrete transparent conductive first electrodes on the substrate, comprising:
   an amorphous semiconductor layer on said transparent electrodes;
   a plurality of second electrodes on said semiconductor layer opposite the transparent electrodes;
   an interface with adsorbed metallic ions between each separate transparent electrode and the opposite conducting electrode;
   and a further interface with adsorbed metallic ions between each second electrode and said amorphous semiconductor layer;
   thereby to enhance the thermal stability of said device.

20. The device of claim 17 wherein said metallic ions are adsorbed upon said first electrode and said amorphous semiconductor to promote contact stability with said first electrode and interface stability between the amorphous semiconductor and the second electrode.

* * * * *